(12) United States Patent
Ernult

(10) Patent No.: US 8,877,019 B2
(45) Date of Patent: Nov. 4, 2014

(54) SPUTTERING APPARATUS, SPUTTER DEPOSITION METHOD, AND ANALYSIS APPARATUS

(75) Inventor: Franck Ernult, Chofu (JP)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 1154 days.

(21) Appl. No.: 12/822,860

(22) Filed: Jun. 24, 2010

(65) Prior Publication Data

US 2010/0258432 A1 Oct. 14, 2010

Related U.S. Application Data

(63) Continuation of application No. PCT/JP2008/073478, filed on Dec. 24, 2008.

(30) Foreign Application Priority Data

Dec. 26, 2007 (JP) .................................. 2007-334236

(51) Int. Cl.
*C23C 14/35* (2006.01)
*H01J 37/32* (2006.01)
*H01L 21/687* (2006.01)
*C23C 14/50* (2006.01)
*H01J 37/34* (2006.01)

(52) U.S. Cl.
CPC ......... *C23C 14/505* (2013.01); *H01J 37/32761* (2013.01); *H01L 21/68764* (2013.01); *H01L 21/68792* (2013.01); *C23C 14/351* (2013.01); *H01L 21/68785* (2013.01); *H01J 37/34* (2013.01)
USPC .............. 204/192.2; 204/298.16; 204/298.27; 204/298.28

(58) Field of Classification Search
USPC ................ 204/192.2, 298.27, 298.28, 298.16
See application file for complete search history.

(56) References Cited

U.S. PATENT DOCUMENTS 5,962,080 A 10/1999 Tan et al.
6,616,816 B2 * 9/2003 Sakai ......................... 204/192.1
(Continued)

FOREIGN PATENT DOCUMENTS

JP 63-065069 A 3/1988
JP 2-272350 A 11/1990
(Continued)

OTHER PUBLICATIONS

International Search Report (PCT/ISA/210) for PCT/JP2008/073478 completed Mar. 26, 2009.
(Continued)

*Primary Examiner* — Rodney McDonald
(74) *Attorney, Agent, or Firm* — Buchanan Ingersoll & Rooney PC

(57) ABSTRACT

A sputtering apparatus includes a substrate holder, a magnetic field applying unit, and target mounting table. The substrate holder includes a first stage which can mount a substrate and can rotate about a first rotating shaft, a second stage which can rotate about a second rotating shaft shifted from the first rotating shaft, a spinning unit which rotates the first stage about the first rotating shaft, and a revolving unit which revolves the first stage about the second rotating shaft. The magnetic field applying unit applies a magnetic field in a specific direction to the substrate. The target mounting table can mount a target configured to deposit a film on the substrate. The spinning unit rotates the first stage in a direction opposite to that of the rotation of the revolving unit, and rotates the first stage so as to maintain the specific direction of the magnetic field.

11 Claims, 12 Drawing Sheets

(56) References Cited

U.S. PATENT DOCUMENTS

| | | | | |
|---|---|---|---|---|
| 7,153,399 | B2 * | 12/2006 | Smith | 204/192.12 |
| 7,294,242 | B1 * | 11/2007 | Hashim et al. | 204/192.2 |
| 2003/0038023 | A1 | 2/2003 | Ramberg et al. | |

FOREIGN PATENT DOCUMENTS

| JP | 03-232964 | * | 10/1991 |
|---|---|---|---|
| JP | 3-266239 | A | 11/1991 |
| JP | 6-213841 | A | 8/1994 |
| JP | 6-256940 | A | 9/1994 |
| JP | 6-325717 | A | 11/1994 |
| JP | 8-220007 | A | 8/1996 |
| JP | 8-296042 | A | 11/1996 |
| JP | 2000-265263 | A | 9/2000 |
| JP | 2002-243672 | A | 8/2002 |
| JP | 2005-500644 | A | 1/2005 |
| JP | 2007-308758 | A | 11/2007 |

OTHER PUBLICATIONS

Written Opinion (PCT/ISA/237) for PCT/JP2008/073478 completed Mar. 26, 2009 (in Japanese).

Office Action issued on Sep. 1, 2014, by the Japan Patent Office in corresponding Japanese Patent Application No. 2013-091769. (2 pages).

* cited by examiner

F I G. 10A
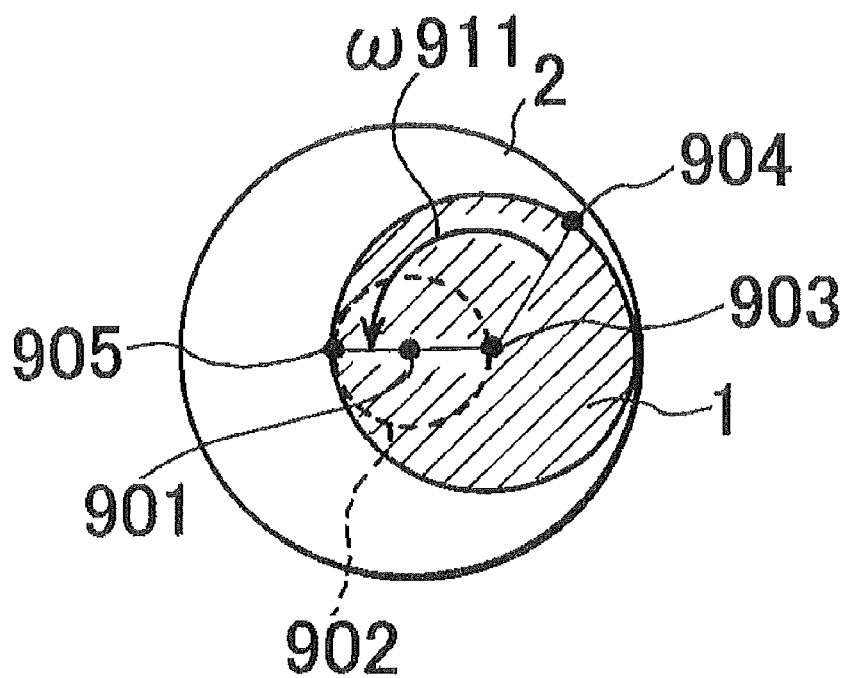
F I G. 10B
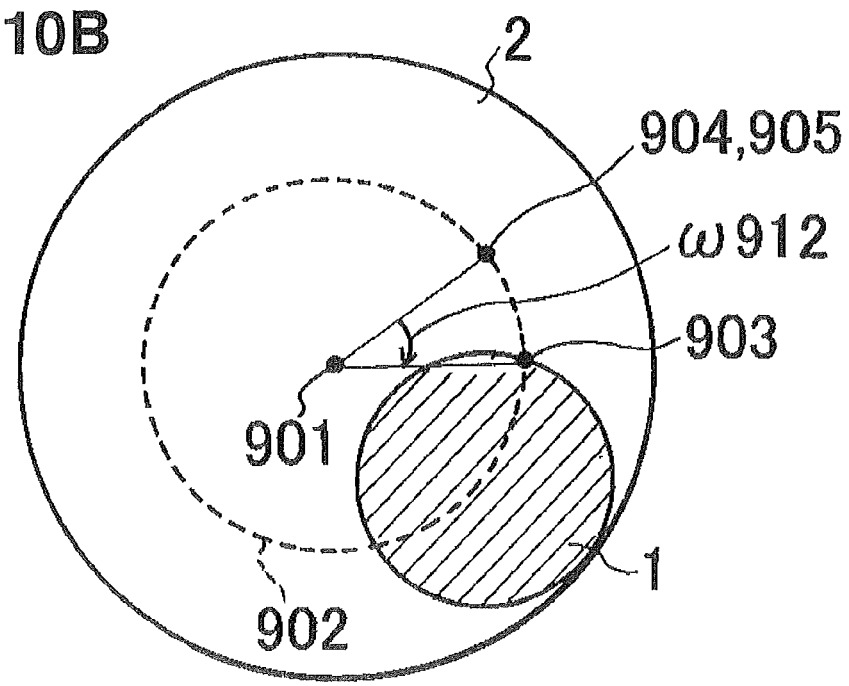

F I G. 13
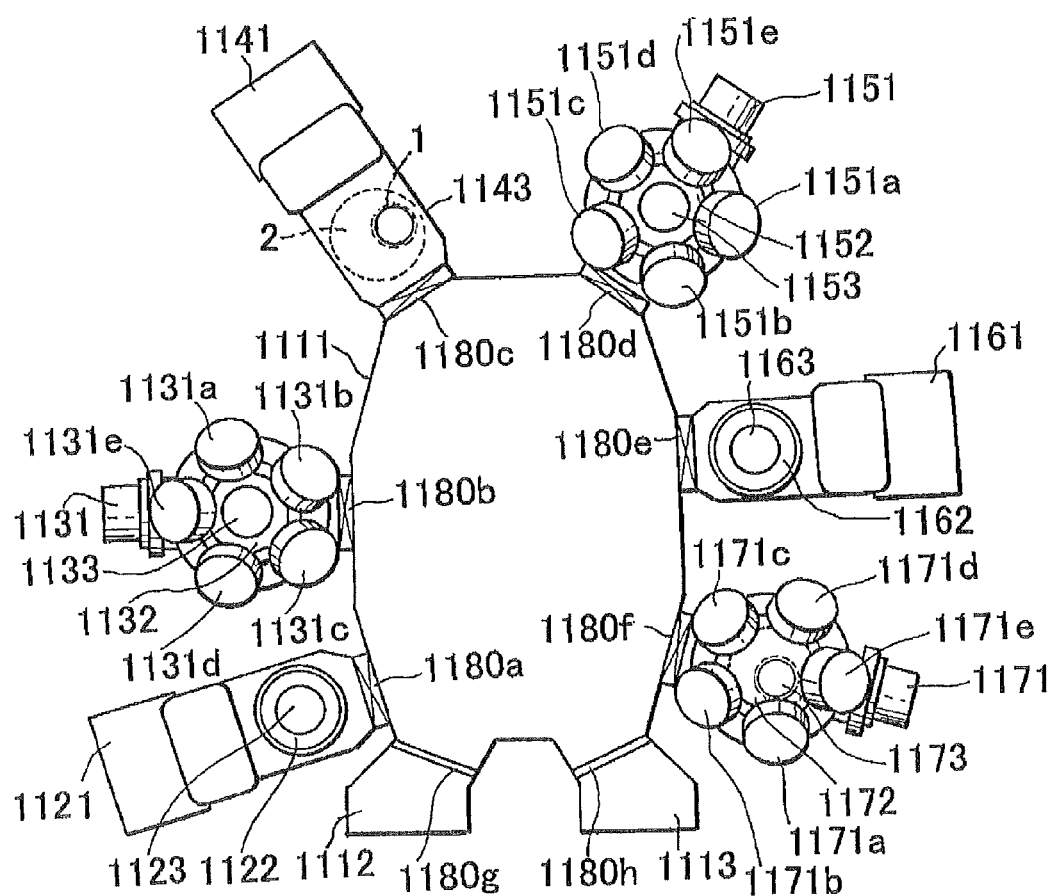

SPUTTERING APPARATUS, SPUTTER DEPOSITION METHOD, AND ANALYSIS APPARATUS

CROSS-REFERENCE TO RELATED APPLICATIONS

The present application is a continuation of PCT/JP2008/073478, filed in Japan on Dec. 24, 2008, and which claims the priority of JP 2007-334236, filed on Dec. 26, 2007. PCT/JP2008/073478 and JP 2007-334236 are incorporated herein by reference.

TECHNICAL FIELD

The present invention relates to a sputtering apparatus, a sputter deposition method, and an analysis apparatus.

BACKGROUND ART

Until recently, a thin film formed on the surface of a substrate needed to have superior thickness uniformity.

To form such a thin film with superior thickness uniformity, a technique for sputtering while spinning and revolving a substrate opposed to a target is commonly used (PLT1).

Another method adopts a so-called oblique rotation sputtering in which sputtering is performed while a target is obliquely tilted with respect to the surface of a substrate and the substrate is rotated (PLT2).

Also, to analyze various kinds of characteristics of a thin film formed on the surface of a substrate, one technique performs substrate surface observation and ultimate analysis by irradiating a substrate with an electron beam or a monochromatic X-ray beam, and detecting signals such as secondary electrons or characteristic X-rays generated by the substrate upon this irradiation.

In this case, to position the substrate analysis position at the beam irradiation position, it is a common practice to place a substrate on a stage including x and y actuators which independently move in the x and y directions, respectively, and move the substrate to the beam irradiation position (PLT3, PLT4, and PLT5).

PLT1: Japanese Patent Laid-Open No. 06-256940
PLT2: Japanese Patent Laid-Open No. 2000-265263
PLT3: Japanese Patent Laid-Open No. 06-213841
PLT4: Japanese Patent Laid-Open No. 06-325717
PLT5: Japanese Patent Laid-Open No. 08-220007

SUMMARY OF INVENTION

Technical Problem

Unfortunately, a soft magnetic layer included in a write head of a hard disk needs to have high magnetic anisotropy. The magnetic anisotropy of the soft magnetic layer is generated by an external magnetic field applied in a fixed direction or oblique sputtering during the formation of a thin film. Especially the angle between the substrate and the target has a great influence on the magnetic anisotropy of the soft magnetic layer.

In forming a thin film using the sputtering method disclosed in PLT1 or PLT2, the direction in which particles sputtered from the target impinge on the substrate incessantly changes upon substrate rotation. This makes it difficult to obtain high magnetic anisotropy.

Also, to position the entire surface of a substrate at the beam irradiation position so as to analyze the characteristics of a thin film formed on the substrate surface, a stage with a width and length at least twice those of the substrate is necessary. To meet this requirement, an analysis chamber, which accommodates the stage, must inevitably be large.

Solution to Problem

The present invention has been made in consideration of the above-described situation, and has as its object to maintain the direction of a substrate in a desired constant direction when viewed from a target set at a position opposite to that of the substrate in a sputtering apparatus and a sputter deposition method.

It is another object of the present invention to provide a compact analysis apparatus.

In order to achieve the above-described objects, according to the present invention, there is provided a sputtering apparatus comprising:

a substrate holder including a first stage which can mount a substrate and can rotate about a first rotating shaft, a second stage which can rotate about a second rotating shaft shifted from the first rotating shaft of the first stage, a spinning unit adapted to rotate the first stage about the first rotating shaft, and a revolving unit adapted to revolve the first stage about the second rotating shaft by rotating the second stage about the second rotating shaft;

a magnetic field applying unit adapted to apply a magnetic field in a specific direction to the substrate; and a target mounting table which can mount a target configured to deposit a film on the substrate, wherein the spinning unit rotates the first stage in a direction opposite to a direction of the rotation of the revolving unit, and rotates the first stage so as to maintain the specific direction of the magnetic field applied to the substrate by the magnetic field applying unit, wherein said revolving unit comprises
a driving unit adapted to generate a rotational motion to rotate said second stage about the second rotating shaft,
said spinning unit comprises
a fixed shaft of which a first end is fixed;
a first gear attached to a second end of said fixed shaft;
a second gear attached to the first rotating shaft; and
a belt member which connects said first gear and said second gear,
wherein a gear ratio between said first gear and said second gear is 1:1.

Also, in order to achieve the above-described objects, according to the present invention, there is provided a sputter deposition method of depositing a film on a substrate by sputtering a particle onto the substrate, comprising:

a placement step of placing the substrate on the substrate holder of the above-mentioned sputtering apparatus including a first stage which can rotate about a first rotating shaft, a second stage which can rotate about a second rotating shaft shifted from the first rotating shaft of the first stage, a spinning unit adapted to rotate the first stage about the first rotating shaft, and a revolving unit adapted to revolve the first stage about the second rotating shaft by rotating the second stage about the second rotating shaft;

a magnetic field applying step of applying a magnetic field in a specific direction to the substrate placed on the substrate holder;

a spinning step of rotating the first stage disposed on the substrate holder about the first rotating shaft;

a revolving step of revolving the first stage about the second rotating shaft by rotating the second stage disposed on the substrate holder about the second rotating shaft; and a control step of rotating the first stage in a direction opposite to a direction of the rotation in the revolving step, and controlling the rotation of the first stage in the spinning step so as to maintain the specific direction of the magnetic field applied to the substrate in the magnetic field applying step.

Also, in order to achieve the above-described objects, according to the present invention, there is provided an analysis apparatus comprising:

a substrate holder including a first stage which can mount a substrate and can rotate about a first rotating shaft, a second stage which can rotate about a second rotating shaft shifted from the first rotating shaft of the first stage, a spinning unit adapted to rotate the first stage about the first rotating shaft, and a revolving unit adapted to revolve the first stage about the second rotating shaft by rotating the second stage about the second rotating shaft;

a beam source which can irradiate the substrate with a beam; and a beam analysis unit adapted to analyze characteristic of a film deposited on the substrate irradiated with the beam from the beam source, wherein a measurement point on the substrate is positioned at an irradiation position of the beam source by the rotations of the spinning unit and the revolving unit, respectively.

Advantageous Effects of Invention

A sputtering apparatus according to the present invention maintains the direction of a substrate constant relative to a target and therefore can form a thin film with high magnetic anisotropy.

Moreover, an analysis apparatus according to the present invention can provide a structure more compact than those in the prior arts.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 10A is a schematic plan view for explaining the ratio between the diameters of the first stage 1 and second stage 2 in the fifth embodiment of the present invention;

FIG. 10B is a schematic plan view for explaining the ratio between the diameters of the first stage 1 and second stage 2 in the fifth embodiment of the present invention;

FIG. 13 is a schematic side view showing the arrangement of a multichamber apparatus including a processing chamber and analysis chamber according to the sixth embodiment of the present invention.

BEST MODE FOR CARRYING OUT THE INVENTION

Embodiments of the present invention will be described in detail below. However, constituent components described in these embodiments are merely examples, and the technical scope of the present invention is determined by the scope of claims and is not limited to the following individual embodiments.

First Embodiment

Figure 1:
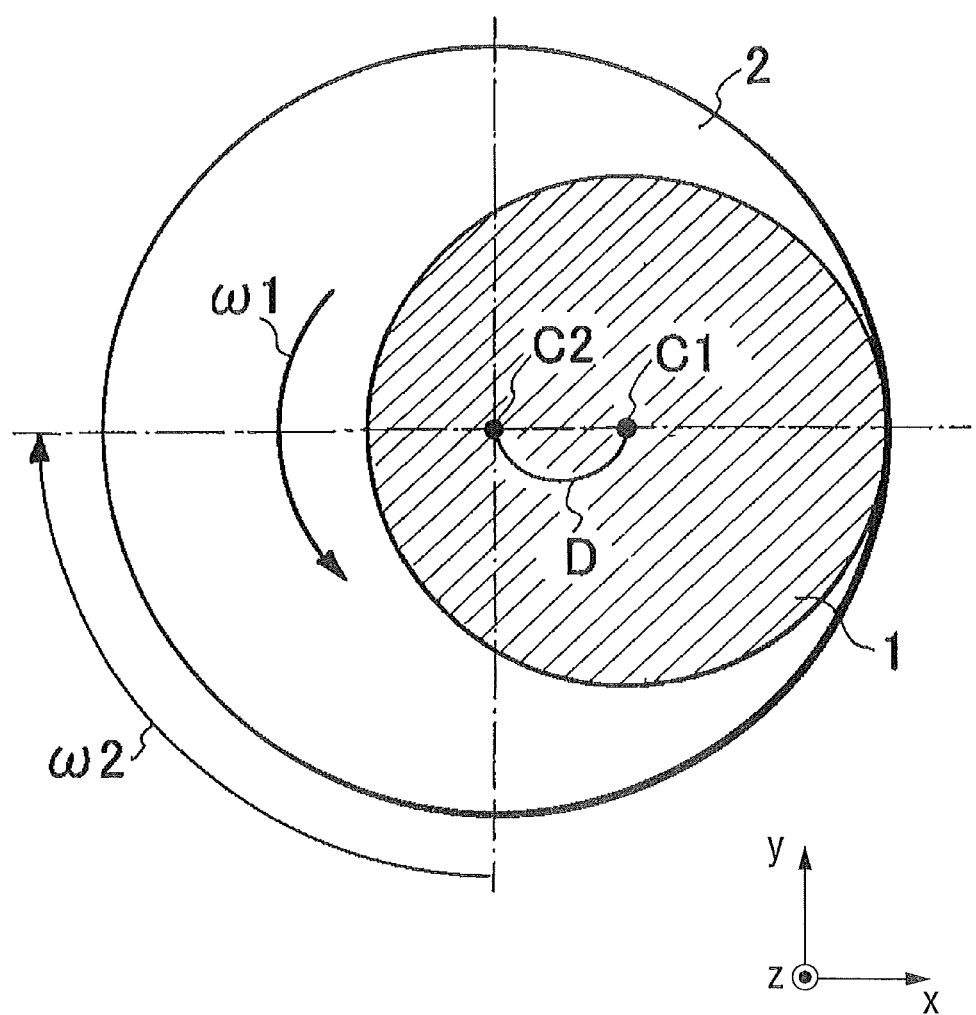
FIG. 1 is a schematic plan view showing the arrangement of a first stage 1 and second stage 2 of a sputtering apparatus according to the first embodiment of the present invention.

FIG. 1 is a schematic plan view showing the arrangement of a first stage 1 and second stage 2 of a sputtering apparatus according to the first embodiment of the present invention.

In a substrate holder of the sputtering apparatus according to this embodiment, the disk-like first stage 1 which mounts a substrate is disposed on the disk-like second stage 2, and the second stage 2 is designed to have a diameter larger than that of the first stage 1.

A cylindrical recess with a diameter larger than that of the first stage 1 is formed in the second stage 2 in its upper portion, and the first stage 1 is fitted in the recess.

The upper surfaces of the first stage 1 and second stage 2 are located on the same level in the vertical direction. This makes it possible to solve a problem that particles are produced as a film adheres to the side surface of the first stage 1. However, an arrangement in which a recess is formed in the second stage is not always indispensable in the present invention. For example, the second stage may be formed to have a flat surface, and the first stage may be disposed on it.

Alternatively, the upper surface of the first stage 1 may be located lower than that of the second stage 2 in accordance with the thickness of a substrate placed on the first stage 1 so that the upper surfaces of the substrate and second stage 2 become flush with each other.

A rotating shaft C1 (first rotating shaft) of the first stage 1 is shifted from a rotating shaft C2 (second rotating shaft) of the second stage 2 by a distance D. The first stage 1 and second stage 2 can be freely rotated in arbitrary directions ω1 and ω2, respectively, which are not limited to those shown in FIG. 1.

Figure 2:
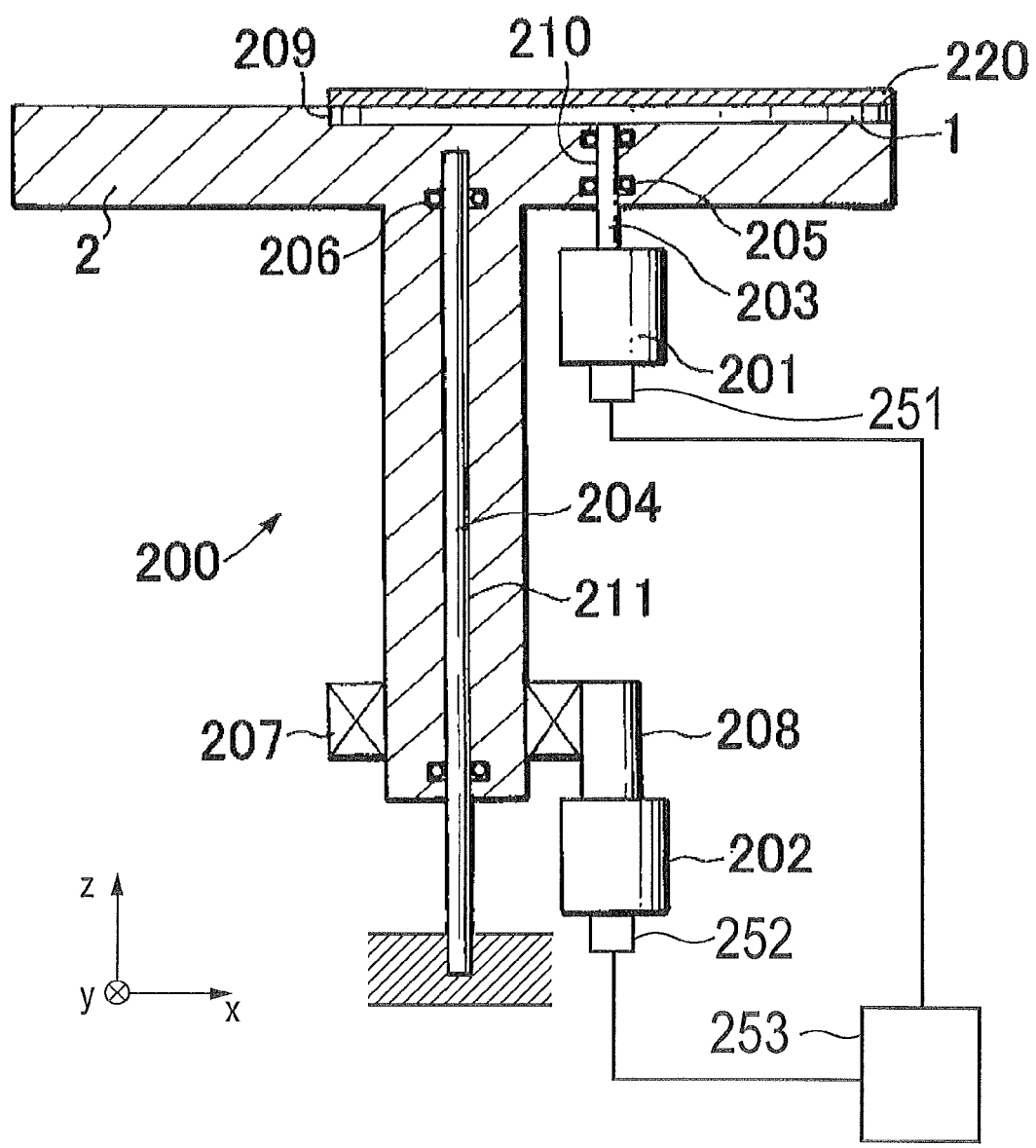
FIG. 2 is a schematic sectional side view showing the arrangement of the first stage 1 and second stage 2 of the sputtering apparatus according to the first embodiment of the present invention.

A spinning unit and revolving unit in the first embodiment of the present invention will be described next with reference to FIG. 2. FIG. 2 is a schematic sectional side view showing the arrangement of the first stage 1 and second stage 2 according to this embodiment.

In this embodiment, the first stage 1 has a diameter equal to that of a substrate 220 and is connected to a rotating shaft 203 at the center of its lower surface. The rotating shaft 203 is supported to be freely rotatable by a plurality of bearings 205 inserted in a first cylindrical space 210, and is connected to a first driving unit 201 such as a servomotor. The first driving unit 201 is fixed at a position below the second stage 2 by a fixing member (not shown). The rotating shaft 203 and first driving unit 201 function as a spinning unit adapted to rotate the first stage 1. Note that the first driving unit 201 includes a detection mechanism 251 formed from, for example, an encoder. The detection mechanism 251 can detect the rotation angle of the first driving unit 201 as its position information, and the rotation speed of the first driving unit 201 as its speed information. The pieces of detection information (position information and speed information) detected by the detection mechanism 251 are input to a controller 253 which functions as a control unit. The controller 253 can control the rotation direction (clockwise and counterclockwise rotation directions) of the first driving unit 201 (position control), and control its rotation speed (speed control), based on the pieces of detection information (position information and speed information) input (fed back) from the detection mechanism 251.

With this structure, the rotation of the first driving unit 201 is transmitted to the first stage 1 through the rotating shaft 203 (first rotating shaft)), so the first stage 1 is spun about the rotating shaft 203 (first rotating shaft) at an arbitrary angle in an arbitrary direction.

The second stage 2 has an arrangement in which a disk-like member and a cylindrical member are connected to each other. The diameter of the cylindrical member is smaller than that of the disk-like member, and the central axis of the disk-like member coincides with that of the cylindrical member. A second cylindrical space 211 with a diameter larger than that of a fixed shaft 204 is formed in the cylindrical member at its center. The second cylindrical space 211 does not penetrate through the second stage 2 in its upper portion and is open only in its lower portion. A disk-like recess 209 with a diameter larger than that of the first stage 1 is formed in the upper surface of the second stage 2. The first stage 1 is fitted in the recess 209. The level of the recess 209 in the vertical direction (z direction) is set equal to that of the first stage 1. With this arrangement, the upper surfaces of the first stage 1 and second stage 2 can serve as a horizontal flat surface.

The first cylindrical space 210 with a diameter larger than that of the rotating shaft 203 is formed in the disk-like recess 209 at its center, and penetrates through the second stage 2 up to its lower portion.

The second stage 2 is set such that the fixed shaft 204 is fitted in the second cylindrical space 211, and the second stage 2 is supported to be freely rotatable by a plurality of bearings 206 inserted in the second cylindrical space 211.

The cylindrical member which forms the lower portion of the second stage 2 includes a gear 207 located at the position where it meshes with a driving transmission shaft 208 connected to a second driving unit 202. The second driving unit 202 includes a detection mechanism 252 formed from, for example, an encoder. The detection mechanism 252 can detect the rotation angle of the second driving unit 202 as its position information, and the rotation speed of the second driving unit 202 as its speed information. The pieces of detection information (position information and speed information) detected by the detection mechanism 252 are input to the controller 253 which functions as a control unit. The controller 253 can control the rotation direction (clockwise and counterclockwise rotation directions) of the second driving unit 202 (position control), and control its rotation speed (speed control), based on the pieces of detection information (position information and speed information) input (fed back) from the detection mechanism 252.

With this structure, the rotation of the second driving unit 202 is transmitted to the driving transmission shaft 208 and gear 207, so the second driving unit 202 rotates the second stage 2 about the rotating shaft 204 (second rotating shaft) at an arbitrary angle in an arbitrary direction. At this time, the rotation of the second stage 2 causes the first stage 1 to revolve about the rotating shaft 204 (second rotating shaft). The gear 207, driving transmission shaft 208, and second driving unit 202 function as a revolving unit adapted to revolve the first stage 1 about the rotating shaft 204 (second rotating shaft) by rotating the second stage 2.

Based on the pieces of detection information (position information and speed information) input from each of the detection mechanisms 251 and 252, the controller 253 can control the rotation (for example, the rotation direction, the rotation angle, and the rotation speed) of the first stage 1 so that the direction of the substrate 220 placed on the first stage 1 is maintained in a desired constant direction relative to the rotation of the second stage 2.

The sputtering apparatus according to this embodiment, having the above-mentioned arrangement, maintains the direction of a substrate constant relative to a target and therefore can form a thin film with high magnetic anisotropy.

Second Embodiment

A spinning unit and revolving unit in a sputtering apparatus according to the second embodiment of the present invention will be described next with reference to FIG. 3.

Figure 3:
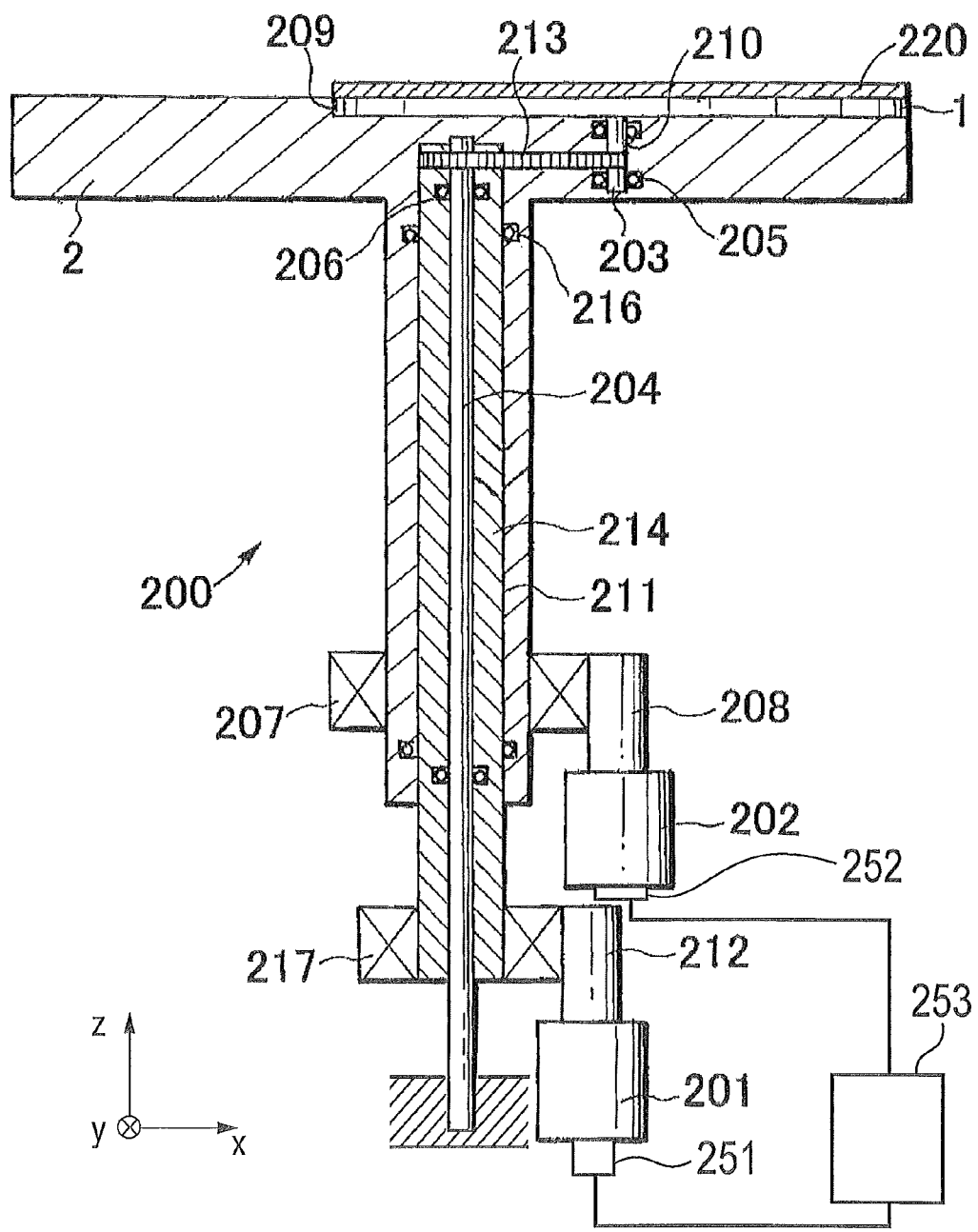
FIG. 3 is a schematic sectional side view showing the arrangement of a first stage 1 and second stage 2 of a sputtering apparatus according to the second embodiment of the present invention.

FIG. 3 is a schematic sectional side view showing the arrangement of a first stage 1 and second stage 2 of the sputtering apparatus according to this embodiment.

The same reference numerals as in the first embodiment denote the same constituent components in the second embodiment, and a detailed description thereof will not be given. The second embodiment is different from the first embodiment in the spinning unit of the first stage 1, and a description will be given in this respect.

In this embodiment, a cylindrical member 214 is inserted between a fixed shaft 204 and a second cylindrical space 211. The cylindrical member 214 has an inner diameter larger than the diameter of the fixed shaft 204, and an outer diameter smaller than the inner diameter of the second cylindrical space 211.

The fixed shaft 204, cylindrical member 214, and second cylindrical space 211 are fitted together in this order from the inside.

The cylindrical member 214 is supported to be freely rotatable by a plurality of bearings 216 inserted in the second cylindrical space 211 and a plurality of bearings 206 inserted in the cylindrical member 214.

A belt 213 is accommodated in a space formed in the second stage 2. The belt 213 transmits the rotation of a gear (not shown) attached to the cylindrical member 214 in its upper portion to a gear (not shown) attached to a rotating shaft 203.

A gear 217 is attached to the cylindrical member 214 in its lower portion and connected to a first driving unit 201 such as a servomotor through a driving transmission shaft 212. A controller 253 controls the rotation operation of the first driving unit 201, as in the first embodiment.

With this structure, the rotation of the first driving unit 201 is transmitted to the driving transmission shaft 212, gear 217, cylindrical member 214, belt 213, and rotating shaft 203. The first driving unit 201 spins the first stage 1 about the rotating shaft 203 (first rotating shaft) at an arbitrary angle in an arbitrary direction. In this embodiment, the first driving unit 201, driving transmission shaft 212, gear 217, cylindrical member 214, belt 213, and rotating shaft 203 function as a spinning unit adapted to rotate the first stage 1.

Also, the cylindrical member 214 which forms the lower portion of the second stage 2 includes a gear 207 located at the position where it meshes with a driving transmission shaft 208 connected to a second driving unit 202. The controller 253 controls the rotation operation of the second driving unit 202, as in the first embodiment. With this structure, the rotation of the second driving unit 202 is transmitted to the driving transmission shaft 208 and gear 207, so the second driving unit 202 rotates the second stage 2 about the rotating shaft 204 (second rotating shaft) at an arbitrary angle in an arbitrary direction. At this time, the rotation of the second stage 2 causes the first stage 1 to revolve about the rotating shaft 204 (second rotating shaft). The gear 207, driving transmission shaft 208, and second driving unit 202 function as a revolving unit adapted to revolve the first stage 1 about the rotating shaft 204 (second rotating shaft) by rotating the second stage 2.

The sputtering apparatus according to this embodiment transmits the rotation of the first driving unit 201 to the rotating shaft 203 through the gears and the belt 213. However, the rotation transmission mechanism is not limited to this example, and can adopt, for example, the rack-and-pinion scheme.

Based on the pieces of detection information (position information and speed information) input from each of detection mechanisms 251 and 252, the controller 253 can control the rotation (for example, the rotation direction, the rotation angle, and the rotation speed) of the first stage 1 so that the direction of a substrate 220 placed on the first stage 1 is maintained in a desired constant direction relative to the rotation of the second stage 2.

The sputtering apparatus according to this embodiment, having the above-mentioned arrangement, maintains the direction of a substrate constant relative to a target and therefore can form a thin film with high magnetic anisotropy.

Third Embodiment

A spinning unit and revolving unit in a sputtering apparatus according to the third embodiment of the present invention will be described next with reference to FIGS. 4 to 6. This embodiment is suitable for forming high magnetic anisotropy required for a soft magnetic layer included in, for example, a write head of a hard disk.

The same reference numerals as in the first embodiment denote the same constituent components in the third embodiment, and a detailed description thereof will not be given. The third embodiment is different from the first embodiment in the spinning unit of a first stage 1, and a description will be given in this respect.

Figure 4:
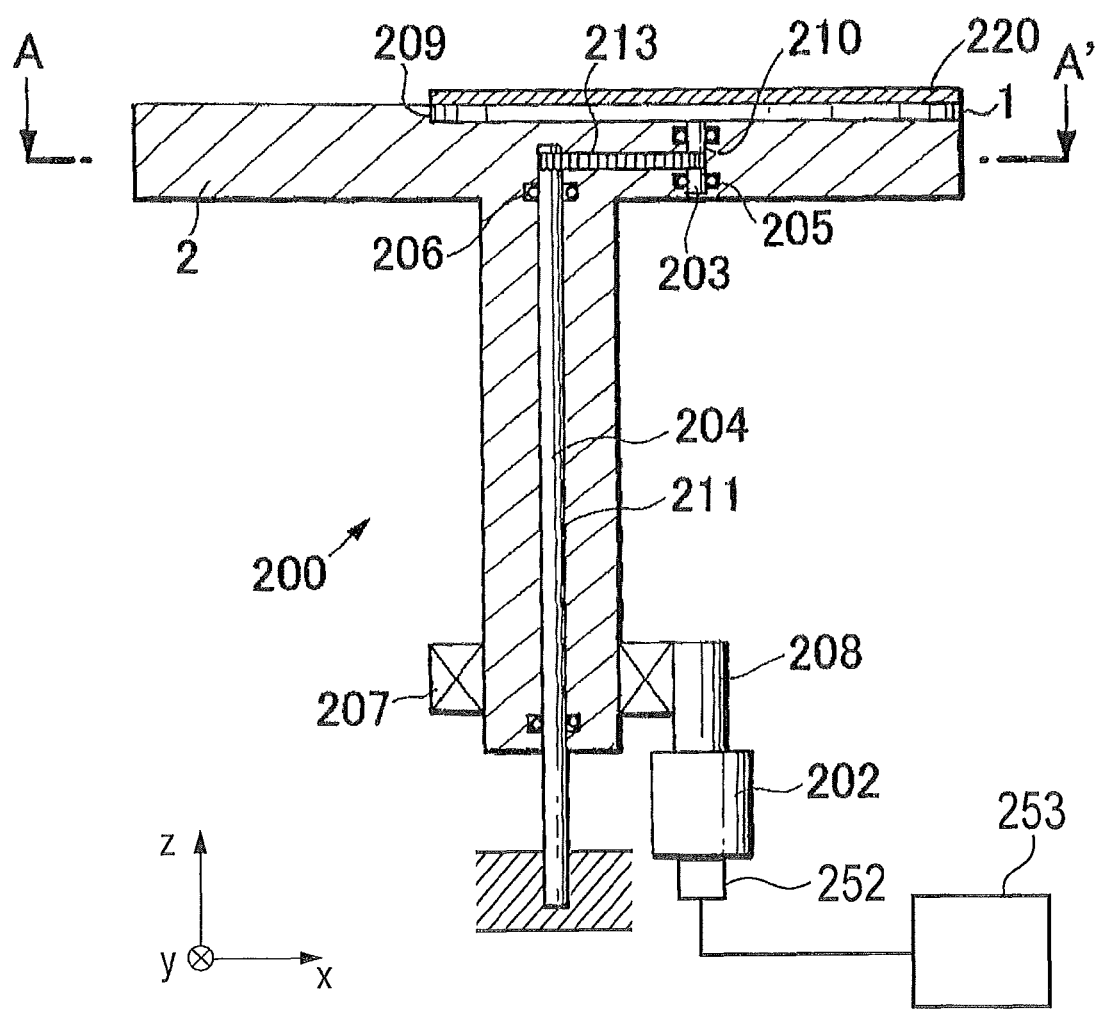
FIG. 4 is a schematic sectional side view showing the arrangement of a first stage 1 and second stage 2 of a sputtering apparatus according to the third embodiment of the present invention.

FIG. 4 is a schematic sectional side view showing the arrangement of the first stage 1 and a second stage 2 of the sputtering apparatus according to this embodiment. FIG. 5 is a sectional view taken along a line A-A' in FIG. 4, that is, a schematic plan view showing the arrangement of the first stage 1 and second stage 2 according to this embodiment.

In this embodiment, a rotating shaft 203 does not penetrate through the second stage 2. A belt 213 is accommodated in a space formed in the second stage 2, and connects a gear (not shown) attached to a fixed shaft 204 in its upper portion and a gear (not shown) attached to the rotating shaft 203.

In this case, a gear (not shown) is attached to the rotating shaft 203 of the first stage 1, which meshes with the belt 213. Also, a gear (not shown) is attached to the fixed shaft 204 which meshes with the belt 213 to form a structure in which the rotation of the belt 213 is transmitted to the gear. At this time, the ratio (gear ratio) between the gears attached to the rotating shaft 203 and fixed shaft 204, respectively, is 1:1.

A second driving unit 202 such as a servomotor includes a driving transmission shaft 208 located at the position where it meshes with a gear 207 attached to a cylindrical member which forms the lower portion of the second stage 2. A controller 253 controls the rotation operation of the second driving unit 202, as in the first embodiment.

Figure 5:
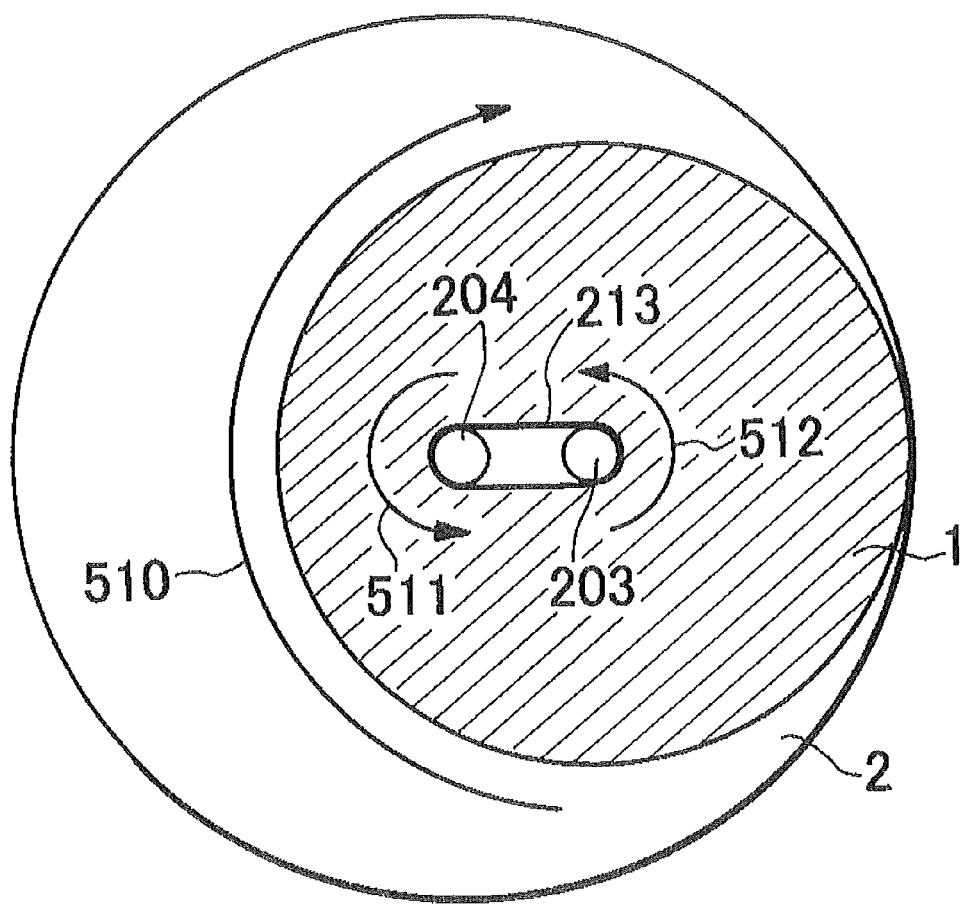
FIG. 5 is a schematic plan view showing the arrangement of the first stage 1 and second stage 2 of the sputtering apparatus according to the third embodiment of the present invention.

Rotation of the second driving unit 202 turns into that of the second stage 2 through the driving transmission shaft 208 and gear 207 in, for example, a direction 510 shown in FIG. 5.

In this embodiment, the gear 207, driving transmission shaft 208, and second driving unit 202 function as a revolving unit adapted to revolve the first stage 1 about the rotating shaft 204 (second rotating shaft) by rotating the second stage 2.

At this time, the fixed shaft 204 inserted in a second cylindrical space 211 in the second stage 2 has its lower end fixed on, for example, a pedestal (not shown) fixing a substrate holder 200 in position, and therefore does not rotate.

Hence, the rotation of the second stage 2 in the direction 510 produces the same action (rotational driving force) as rotation in a direction 511 (see FIG. 5) opposite to the direction 510 in the belt 213 suspended over the gear attached to the fixed shaft 204.

The rotation of the belt 213 in the direction 511 causes the rotating shaft 203 over which the belt 213 is suspended to rotate in a direction 512 shown in FIG. 5, and the first stage 1 fixed on the rotating shaft 203, in turn, rotates in the same direction 512.

In this embodiment, the rotating shaft 204, the gears, the belt 213, the rotating shaft 203, and the second driving unit 202 function as a spinning unit. As a result, the first stage 1 and second stage 2 rotate in opposite directions. A substrate 220 placed on the first stage 1 undergoes spinning of the first stage 1 and its revolution about the rotating shaft 204 (second rotating shaft) on the second stage 2 which rotates about the rotating shaft 204 (second rotating shaft).

Note that because the gear ratio between the gears attached to the rotating shaft 203 and fixed shaft 204, respectively, is 1:1, the substrate 220 placed on the first stage 1 spins and revolves while maintaining a constant direction.

The sputtering apparatus according to this embodiment transmits the rotation of the second driving unit 202 to the rotating shaft 203 of the first stage 1 through the gears and the belt 213. However, the rotation transmission mechanism is not limited to this example, and can adopt, for example, the rack-and-pinion scheme.

Figure 6:
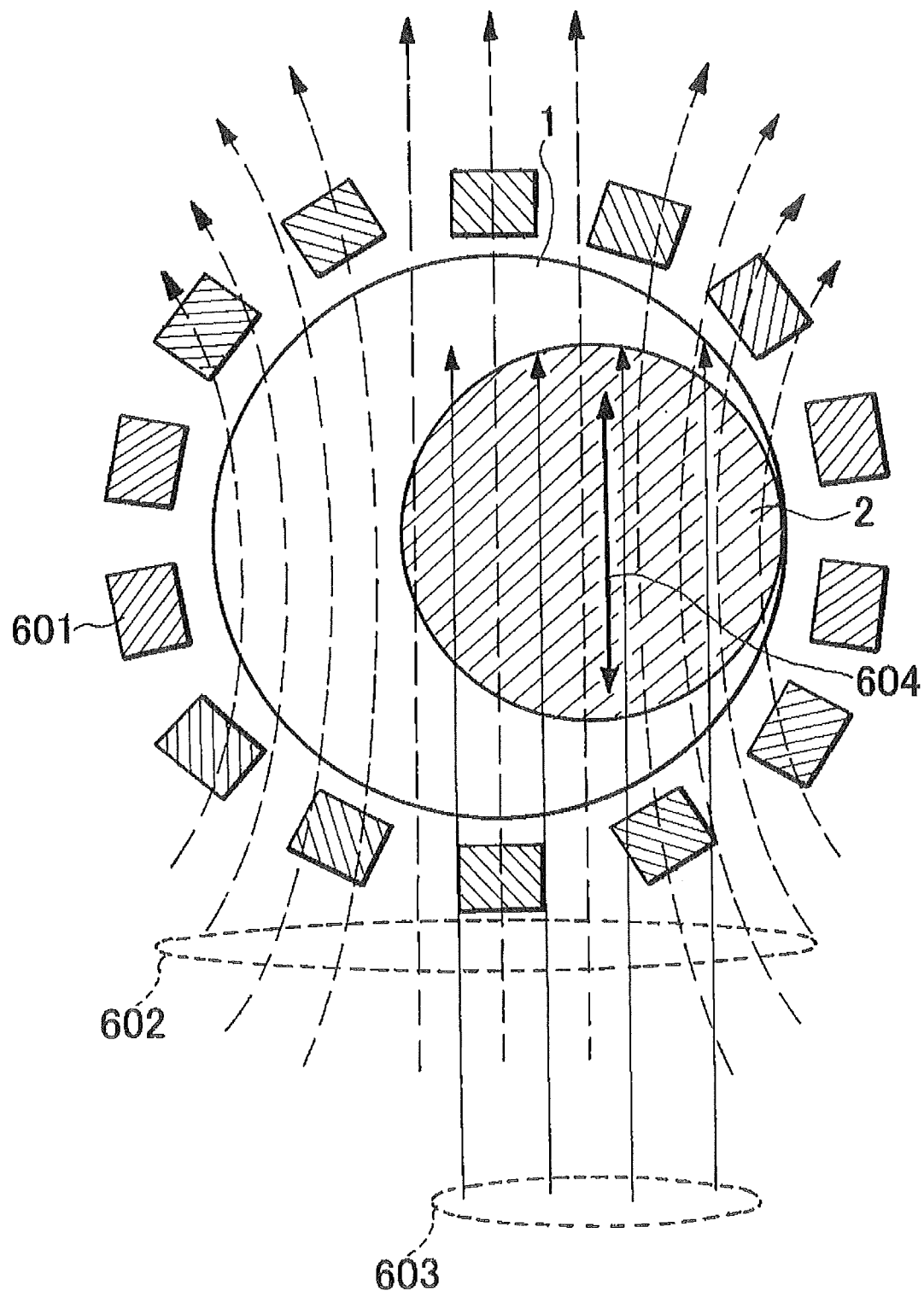
FIG. 6 is a schematic plan view showing an arrangement in which a plurality of magnets 601 are arranged around a substrate holder.

FIG. 6 is a schematic plan view showing an arrangement in which a plurality of magnets 601 are arranged around the substrate holder.

A thin film with its magnetic anisotropy enhanced can be formed by magnetic lines of force 602 generated by the plurality of magnets 601 (magnetic field applying unit) disposed around the substrate holder.

That is, a direction 604 of magnetic anisotropy to be imparted to a film deposited on the substrate may become different from a direction 603, in which sputtered particles impinge on the substrate, depending on the deposition conditions during substrate deposition processing.

A thin film with its magnetic anisotropy enhanced can be formed by correcting the direction 603 in which sputtered particles impinge on the substrate to the direction 604 of magnetic anisotropy to be imparted to the substrate.

In this case, the magnetic lines of force 602 generated by the plurality of magnets 601 need to run in the direction 604 of magnetic anisotropy to be imparted to the substrate over the range in which the substrate spins and revolves, that is, the entire second stage 2. To meet this requirement, it is important to adjust the arrangement of the plurality of magnets 601 and the magnetic force.

Even when, for example, the direction 603 in which sputtered particles impinge on the substrate is matched with the direction 604 of magnetic anisotropy, the direction of magnetic anisotropy to be imparted to the substrate may become different from the direction 604 depending on the deposition conditions such as the pressure.

In this embodiment, permanent magnets are adopted as the plurality of magnets 601. Nevertheless, in this case, electromagnets which can arbitrarily control the direction and strength of the magnetic lines of force 602 are desirably adopted.

Based on the pieces of detection information (position information and speed information) input from a detection mechanism 252, the controller 253 can control the rotation (for example, the rotation direction, the rotation angle, and the rotation speed) of the first stage 1 so that the direction of the substrate 220 placed on the first stage 1 is maintained in a desired constant direction relative to the rotation of the second stage 2.

The sputtering apparatus according to this embodiment, having the above-mentioned arrangement, maintains the direction of a substrate constant relative to a target and therefore can form a thin film with high magnetic anisotropy.

Fourth Embodiment

A substrate processing chamber which uses a substrate holder will be described next with reference to FIG. 7 as the fourth embodiment of the present invention.

Figure 7:
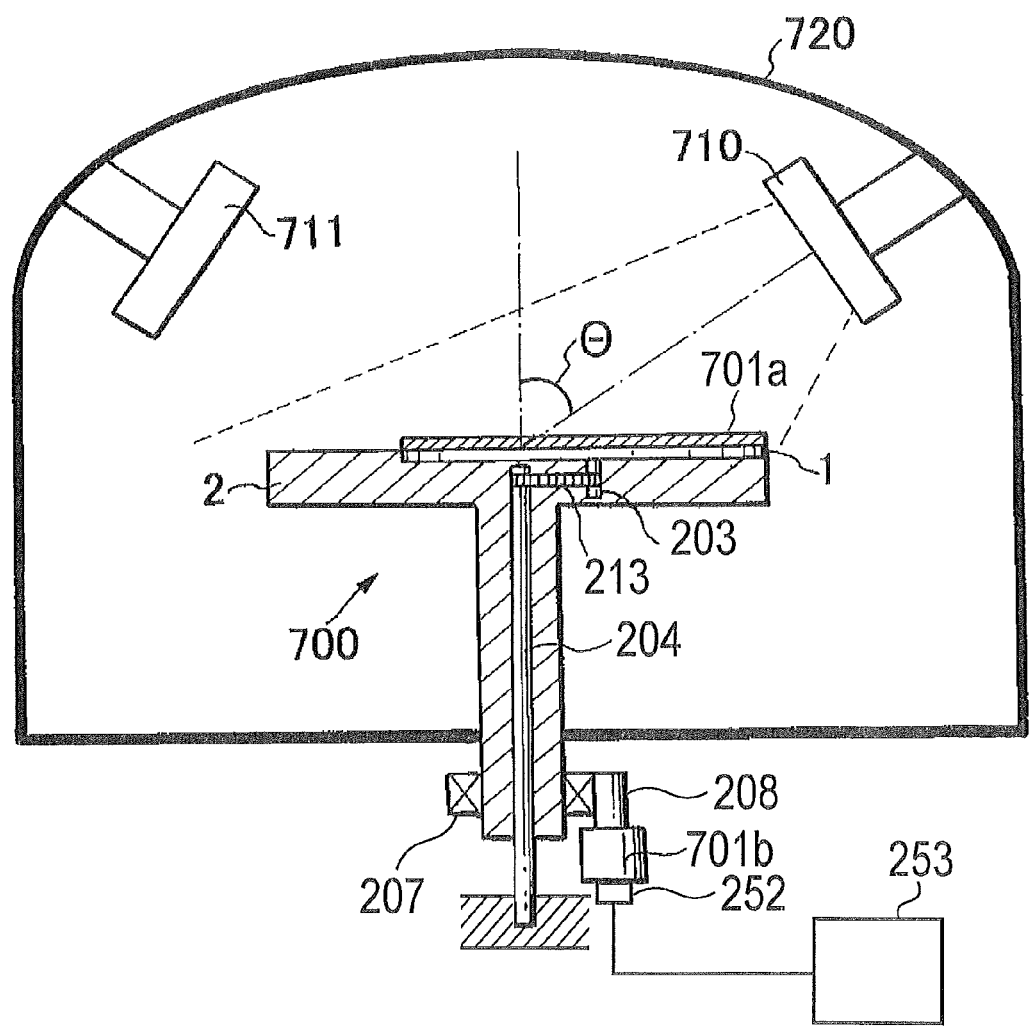
FIG. 7 is a schematic sectional side view showing the arrangement of a substrate processing chamber which uses a substrate holder as the fourth embodiment of the present invention.

FIG. 7 is a schematic sectional side view showing the arrangement of a substrate processing chamber which uses a substrate holder as the fourth embodiment of the present invention.

In the substrate processing chamber shown in FIG. 7, a substrate holder 700 is placed in the lower portion of a vacuum chamber 720. Targets 710 and 711 are placed on target mounting tables at sputtering cathodes (not shown) in the upper portion of the vacuum chamber 720 while being obliquely tilted with respect to the substrate mounting surface of the substrate holder 700, that is, while being nonparallel to that surface.

Although only the targets 710 and 711 are used in FIG. 7, the number of targets is not limited to two. Although the vacuum chamber 720 accommodates, for example, substrate loading and unloading gate valves, a vacuum exhaust unit, a gas introduction unit, a power supply unit, and a substrate transport unit, they are not illustrated in FIG. 4. Also, the substrate holder 700 shown in FIG. 7 is basically the same as the substrate holder 200 shown in FIG. 4, and a detailed description thereof will not be given.

A process of forming a thin film will be explained next. First, the substrate transport unit loads a substrate 701a into the vacuum chamber 720 and places it on a first stage 1.

After the vacuum exhaust unit evacuates the vacuum chamber 720, the gas introduction unit controls a predetermined gas to a predetermined flow rate and introduces it into the vacuum chamber 720.

A driving unit 701b (corresponding to the second driving unit 202) such as a servomotor rotates a second stage 2. As the driving unit 701b rotates the first stage 1, the substrate 701a spins and revolves about a rotating shaft 204.

After the substrate 701a starts spinning and revolving or simultaneously with the start of its spinning and revolution, the power supply unit supplies power to the target 710. Plasma discharge then takes place in the vacuum chamber 720, so particles sputtered from the target 710 reach the surface of the substrate 701a to form a thin film.

At this time, it is possible to form a thin film with high magnetic anisotropy because the direction of the substrate 701a is maintained constant relative to the target 710 during spinning and revolution. It is also possible to change the characteristics of the thin film by adjusting the rotation speed of the driving unit 701b.

The incident angle $\theta$ of sputtered particles preferably is 45° or more. The incident angle $\theta$ means herein the angle between a normal to the target 710 and that to the substrate mounting surface of the substrate holder 700.

The substrate 701a cyclically moves between a position farther from the target 710 and a position closer to it by revolution. In this case, the rate of deposition at which a thin film is formed drops at a position farther from the target 710, while it rises, at a position closer to the target 710. The film thickness uniformity can be improved by alternately performing low-rate deposition processing and high-rate deposition processing by revolution.

The first stage 1 preferably has a diameter smaller than that of the second stage 2. To improve the film thickness uniformity of the entire substrate surface, the ratio between the diameters of the first stage 1 and second stage 2 is desirably as high as possible.

A soft magnetic body may have magnetic anisotropy in an arbitrary magnetization direction as long as this direction is an axial direction in which magnetic anisotropy exists. Hence, magnetic anisotropy can be obtained even when sputtered particles impinge on the substrate 701a in directions different from each other by 180°.

This fact can be exploited to improve the film thickness uniformity. That is, the direction of the substrate 701a is rotated through 180° at an arbitrary timing during deposition processing. As the substrate 701a rotates through 180°, the rate of deposition drops at a position farther from the target 710 on the surface of the substrate 701a, while it rises at a position closer to the target 710 on that surface. Low-rate deposition processing and high-rate deposition processing are alternately performed by further rotating the direction of the substrate 701a through 180°. This makes it possible to alleviate the problem of film thickness nonuniformity.

This is effective especially when only one target sputters particles.

To reverse the direction of the substrate 701a by 180°, a controller 253 controls a gear connection/releasing unit (not shown) which performs connection or connection cancellation between a belt 213 and a gear (not shown) which connects a rotating shaft 203 of the first stage 1 and the rotating shaft 204 of the second stage 2. First, the gear connection/releasing unit temporarily cancels the connection between the belt 213 and the gear (not shown) so that the rotation of the fixed shaft 204 is not transmitted to the rotating shaft 203. Therefore, the first stage 1 which mounts the substrate 701a temporarily stops spinning.

After that, the first stage 1 which mounts the substrate 701a further rotates through 180° by revolution about the rotating shaft 204. At the same time, the gear connection/releasing unit connects the belt 213 and the gear (not shown) again, so the rotation of the fixed shaft 204 is transmitted to the rotating shaft 203. With this operation, the first stage 1 which mounts the substrate 701a restarts spinning. A process of reversing the substrate direction as described above is repeated a predetermined number of times during deposition processing.

The arrangement of a substrate holder which rotates the first stage 1 while maintaining constant the direction of a magnetic field applied from the magnetic field applying unit to the substrate is not limited to that shown in FIG. 7. For example, with the arrangement of the substrate holder 200 shown in FIG. 2 or 3, the controller 253 can control the first driving unit 201 and second driving unit 202 so as to reverse the spinning and revolution directions, and further control the spinning and revolution speeds so as to maintain constant the direction of a magnetic field applied to the substrate by the magnets 601 (magnetic field applying unit).

Fifth Embodiment

Figure 8:
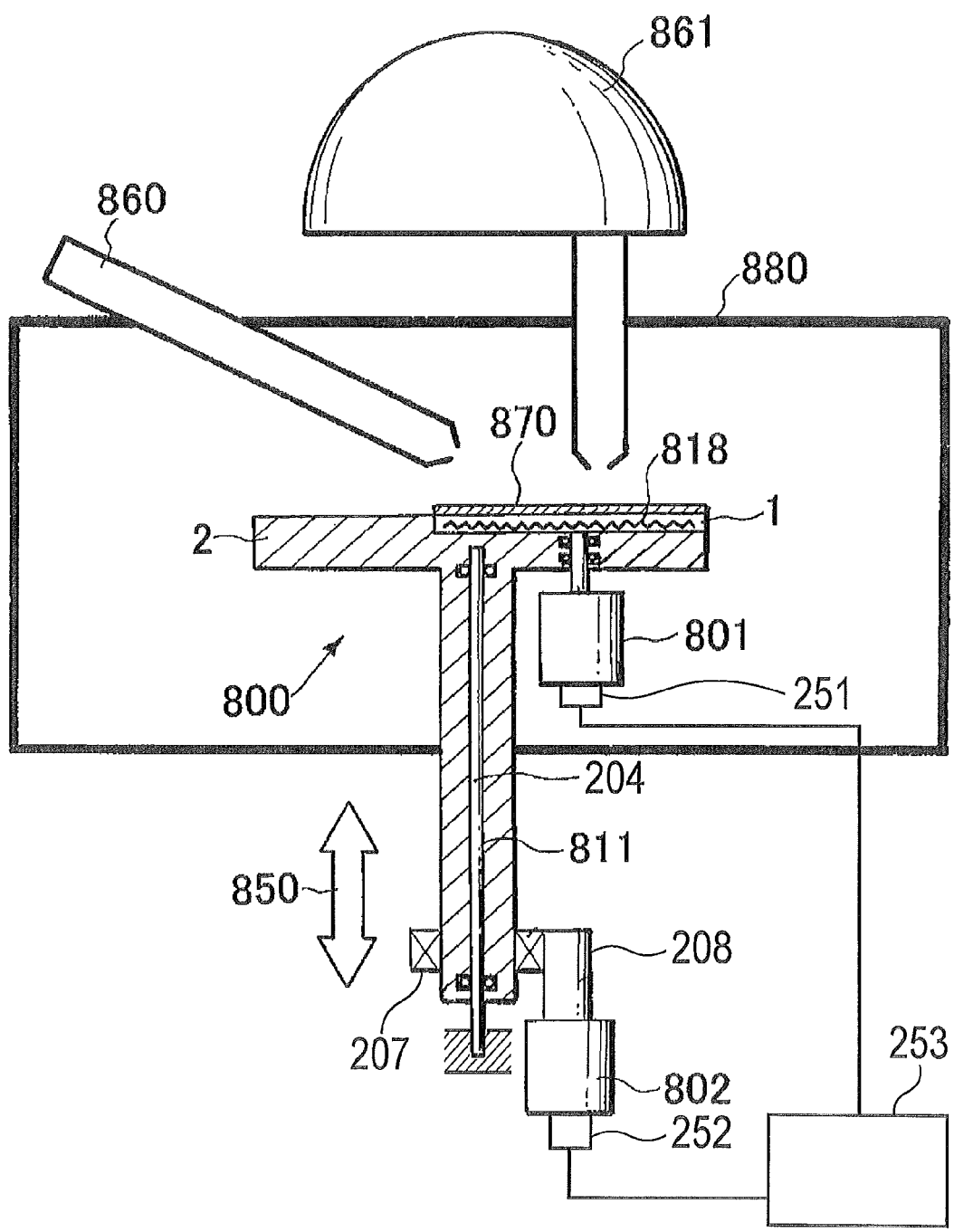
FIG. 8 is a schematic sectional side view showing the arrangement of an analysis chamber which uses a substrate holder as the fifth embodiment of the present invention.

An analysis chamber which uses a substrate holder will be described next with reference to FIG. 8 as the fifth embodiment of the present invention. FIG. 8 is a schematic sectional side view showing the arrangement of an analysis chamber which uses a substrate holder 800.

Although the beam source used is an electron beam source in this embodiment, it is not limited to an electron beam source. The beam source used may be, for example, an X-ray beam source or an ion beam source as long as substrate surface observation and ultimate analysis can be done by irradiating the surface of a substrate with a beam, and detecting signals such as secondary electrons or characteristic X-rays generated by the substrate upon this irradiation.

In the analysis chamber shown in FIG. 8, the substrate holder 800 is placed in the lower portion of a vacuum chamber 880, and an electron beam source 860 and beam analysis unit 861 are placed in the upper portion of the vacuum chamber 880. Although the vacuum chamber 880 accommodates, for example, substrate loading and unloading gate valves, a vacuum exhaust unit, a gas introduction unit, a power supply unit, and a substrate transport unit, they are not illustrated in FIG. 8.

The basic arrangement of the substrate holder 800 in this embodiment is the same as that of the substrate holder 200 shown in FIG. 2, and a detailed description thereof will not be given. The substrate holder 200 shown in FIG. 3, for example, can also be adopted as the substrate holder in this embodiment.

A process of measuring the characteristics of a thin film formed on the surface of a substrate will be described next.

First, a substrate holder vertical driving unit 850 lowers the substrate holder 800 to a lowermost position.

After that, the substrate transport unit loads a substrate 870 into the vacuum chamber 880 and places it on a first stage 1.

The substrate holder vertical driving unit 850 lifts the substrate holder 800 positioned at the lowermost position up to the analysis position.

The vacuum exhaust unit evacuates the vacuum chamber 880. A driving unit 802 such as a servomotor rotates a second stage 2 through a predetermined angle to revolve the first stage 1 about a rotating shaft 204, and a driving unit 801 such as a servomotor spins the first stage 1 through a predetermined angle. In this way, a measurement point on the substrate 870 is positioned at the irradiation position of the electron beam source 860.

After that, the electron beam source 860 irradiates the substrate 870 with a beam, and the beam analysis unit 861 analyzes signals such as secondary electrons or characteristic X-rays generated by the substrate 870 upon this irradiation to measure the characteristics of a thin film formed on the substrate surface.

At this time, a substrate heating unit 818 built in the first stage 1 can adjust the substrate 870 to a predetermined temperature.

The ratio between the diameters of the first stage 1 and second stage 2 will be described next with reference to FIGS. 9A and 9B to 11. Note that the first stage 1 which mounts a substrate has a diameter equal to that of the substrate.

A mechanism in which a measurement point on a substrate in its peripheral portion, farthest from the beam irradiation position, is matched with the beam irradiation position will be described below.

FIGS. 9A and 9B to 11 are schematic plan views showing an arrangement for explaining the ratio between the diameters of the first stage 1 and second stage 2 in the fifth embodiment of the present invention.

A method of matching a measurement point 904 on a substrate with a beam irradiation position 903 if the second stage 2 has a diameter twice or more that of the substrate will be described first with reference to FIGS. 9A and 9B.

Figure 9A:
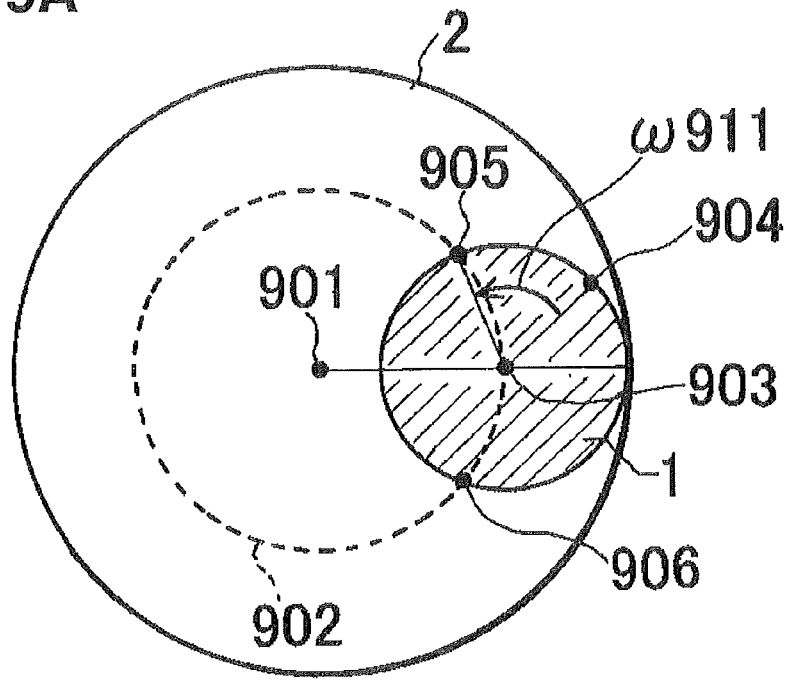
FIG. 9A is a schematic plan view for explaining the ratio between the diameters of a first stage 1 and second stage 2 in the fifth embodiment of the present invention.

The substrate placed on the first stage 1 and the second stage 2 have a positional relationship as shown in FIG. 9A. In this relationship, there are two points 905 and 906 where a track 902 formed by the rotating shaft of the first stage 1 intersects with the peripheral portion (outer peripheral portion) of the substrate.

First, the measurement point 904 is matched with the point 905 by spinning the first stage 1 in the counterclockwise direction on the paper surface through an angle ω911 (FIG. 9A).

Figure 9B:
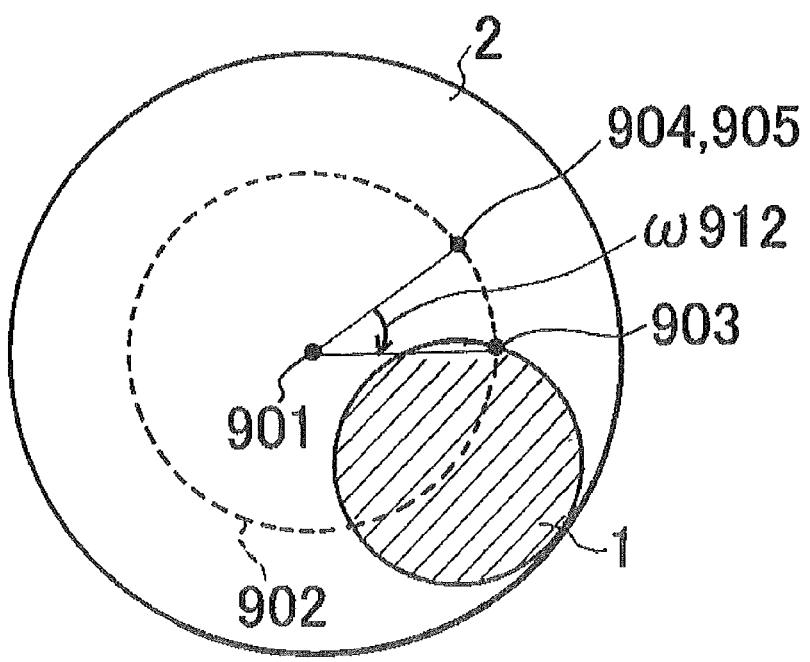
FIG. 9B is a schematic plan view for explaining the ratio between the diameters of the first stage 1 and second stage 2 in the fifth embodiment of the present invention.

Next, the measurement point 904 can be matched with the beam irradiation position 903 by revolving the second stage 2 in the clockwise direction on the paper surface through an angle ω912 (FIG. 9B). The spinning of the first stage 1 and the revolution of the second stage 2 based on its rotation about a rotating shaft 901 may be done simultaneously.

A method of matching a measurement point 904 on a substrate with a beam irradiation position 903 if the second stage 2 has a diameter 1.5 times that of the substrate will be described next with reference to FIGS. 10A and 10B.

The substrate placed on the first stage 1 and the second stage 2 have a positional relationship as shown in FIG. 10A. In this relationship, there is only one point 905 where a track 902 formed by the rotating shaft of the first stage 1 upon rotation of the second stage 2 is in contact with the peripheral portion (outer peripheral portion) of the substrate.

First, the measurement point 904 is matched with the point 905 by spinning the first stage 1 in the counterclockwise direction on the paper surface through an angle ω911 (FIG. 10A).

Next, the measurement point 904 can be matched with the beam irradiation position 903 by rotating the second stage 2 in the counterclockwise direction (or the clockwise direction) on the paper surface through an angle ω912 (180°) (FIG.

10B). The rotation of the first stage 1 and that of the second stage 2 may be done simultaneously.

A mechanism in which a region in which a measurement point 904 on the substrate cannot be matched with a beam irradiation position 903 is formed if the second stage 2 has a diameter smaller than 1.5 times that of the substrate will be described lastly with reference to FIG. 11.

Figure 11:
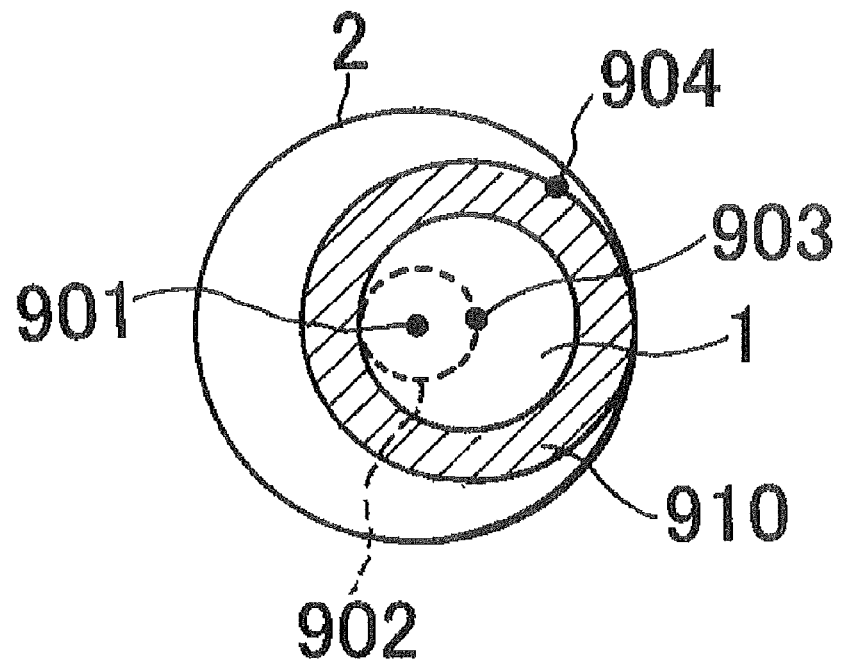
FIG. 11 is a schematic plan view for explaining the ratio between the diameters of the first stage 1 and second stage 2 in the fifth embodiment of the present invention.

The substrate placed on the first stage 1 and the second stage 2 have a positional relationship as shown in FIG. 11. In this relationship, there is no point where a track 902 formed by the rotating shaft of the first stage 1 intersects with the peripheral portion (outer peripheral portion) of the substrate.

Therefore, even when the first stage 1 is spun, the measurement point 904 corresponding to the peripheral portion (outer peripheral portion) of the substrate cannot be matched with any point on the track 902, and cannot be matched with the beam irradiation position 903 as well. Similarly, even when the measurement point 904 falls within the inner region of the substrate, it cannot be matched with the beam irradiation position 903 if it falls within a region 910 where there is no point which intersects with the track 902.

From the foregoing viewpoint, the second stage 2 needs to have a diameter 1.5 times or more that of the substrate (first stage 1) to allow measurement of the entire substrate.

Figure 12:
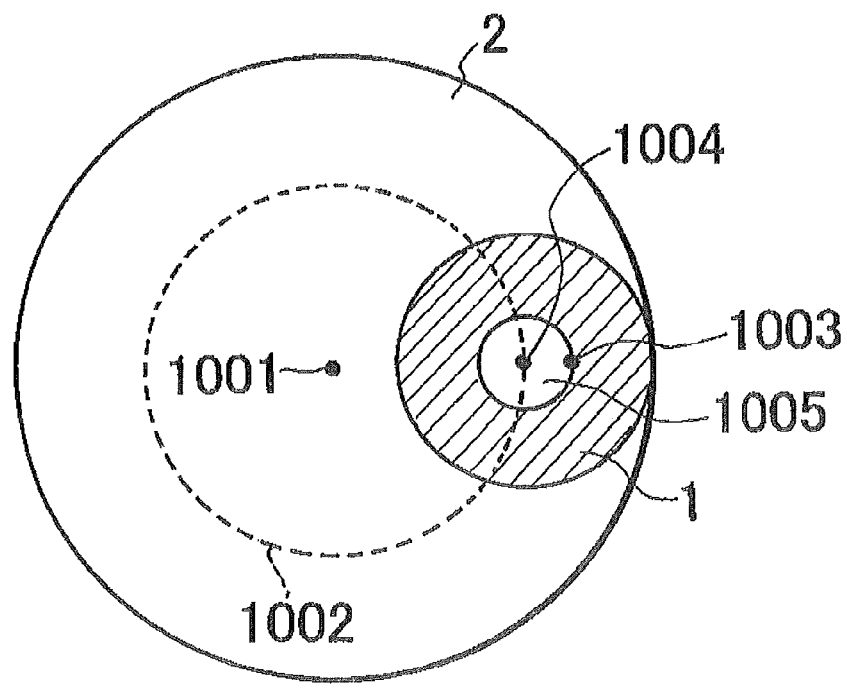
FIG. 12 is a schematic plan view showing the positional relationship between the beam irradiation position and a track formed by the rotating shaft of the first stage in the fifth embodiment of the present invention.

FIG. 12 is a schematic plan view showing the positional relationship between the beam irradiation position and a track formed by the rotating shaft of the first stage in the fifth embodiment of the present invention.

Referring to FIG. 12, when the first stage 1 revolves on the second stage 2, a beam irradiation position 1003 falls outside a track 1002 formed by a rotating shaft 1004 of the first stage 1.

In this case, if the measurement point falls within a region 1005, it obviously cannot be matched with the beam irradiation position 1003 even by substrate spinning and revolution.

To eliminate the region 1005, it is necessary to match the beam irradiation position 1003 and the rotating shaft 1004 of the first stage 1. In other words, it is necessary to limit the beam irradiation position 1003 to only one point on the track 1002 formed by the rotating shaft 1004 of the first stage 1 when the first stage 1 revolves on the second stage 2.

Sixth Embodiment

A substrate processing apparatus including a substrate processing chamber and analysis chamber according to the present invention will be described next with reference to FIG. 13 as the sixth embodiment.

FIG. 13 is a schematic side view showing the arrangement of a substrate processing apparatus including a processing chamber and analysis chamber according to the sixth embodiment of the present invention. The substrate processing apparatus shown in FIG. 13 is of the cluster type, which includes a plurality of processing chambers. A vacuum transport robot (not shown) for substrate transportation is placed at the center of a core chamber 1111. The core chamber 1111 includes load lock chambers 1112 and 1113.

The load lock chambers 1112 and 1113 load a substrate from the outside into the substrate processing apparatus, and unload the substrate having undergone predetermined processing from the substrate processing apparatus to the outside. Gate valves 1180g and 1180h each of which separates two chambers from each other and is freely openable/closable as needed are inserted between the core chamber 1111 and the load lock chambers 1112 and 1113, respectively. Two load lock chambers are used in this case to enhance the productivity by alternately using these two chambers in accordance with circumstances involved.

In the substrate processing apparatus shown in FIG. 13, three deposition chambers 1131, 1151, and 1171, one oxidation processing chamber 1161, one cleaning chamber 1121, and one analysis chamber 1141 are arranged around the core chamber 1111.

Gate valves 1180a to 1180f each of which separates two chambers from each other and is freely openable/closable as needed are inserted between the core chamber 1111 and the processing chambers, respectively. Although each chamber accommodates, for example, a vacuum exhaust unit, a gas introduction unit, and a power supply unit, they are not illustrated in FIG. 13.

Each of the deposition chambers 1131, 1151, and 1171 of the substrate processing apparatus shown in FIG. 13 serves to continuously deposit a predetermined magnetic thin film in the same chamber. Of these chambers, the deposition chamber 1171 serves as the substrate processing chamber shown in FIG. 7, and the analysis chamber 1141 serves as the analysis chamber shown in FIG. 8, and these chambers have the same basic structures as those shown in FIGS. 7 and 8.

In the deposition chamber 1131, targets 1131a to 1131d are placed on the ceiling through sputtering cathodes (not shown) for a substrate 1133 placed on a substrate holder 1132 at the chamber bottom center. The deposition chamber 1131 can also accommodate a target 1131e, as shown in FIG. 13, and can even use it as appropriate in accordance with the embodiment.

The gate valve 1180b which separates two chambers from each other and is freely openable/closable as needed is inserted between the core chamber 1111 and the deposition chamber 1131.

In the deposition chamber 1151, targets 1151a to 1151c are placed on the ceiling through sputtering cathodes (not shown) for a substrate 1153 placed on a substrate holder 1152 at the chamber bottom center.

The deposition chamber 1151 can also accommodate targets 1151d and 1151e, as shown in FIG. 13, and can even use them as appropriate in accordance with the embodiment. The gate valve 1180d which separates two chambers from each other and is freely openable/closable as needed is inserted between the core chamber 1111 and the deposition chamber 1151. The deposition chamber 1171 serves as the substrate processing chamber shown in FIG. 7, and a description thereof will not be given.

The cleaning chamber 1121 in the substrate processing chamber shown in FIG. 13 accommodates an ion beam etching unit and RF sputter etching for a substrate 1123 placed on a substrate holder 1122 at the chamber bottom center. The cleaning chamber 1121 cleans a substrate before deposition by physical etching.

The gate valve 1180a which separates two chambers from each other and is freely openable/closable as needed is inserted between the core chamber 1111 and the cleaning chamber 1121.

The oxidation processing chamber 1161 of the substrate processing apparatus shown in FIG. 13 accommodates an oxygen introduction unit adapted to bring about a surface chemical reaction to oxidize a metal layer on a substrate 1163 placed on a substrate holder 1162 at the chamber bottom center.

Natural oxidation using an oxygen atmosphere at reduced pressure is adopted in this embodiment. The gate valve 1180e which separates two chambers from each other and is freely openable/closable as needed is inserted between the core chamber 1111 and the oxidation processing chamber 1161.

The procedure for forming a multilayered magnetic thin film by the substrate processing apparatus shown in FIG. 13 will be described next. First, a substrate is placed in the load lock chamber 1112 of the substrate processing apparatus shown in FIG. 13. Next, the load lock chamber 1112 is evacuated.

The vacuum transport robot transports the substrate from the load lock chamber 1112 into the cleaning chamber 1121. After that, the ion beam etching mechanism and RF sputter etching mechanism etch the substrate surface to clean and planarize it.

The substrate is transported into one of the deposition chambers 1131, 1151, and 1171, and a predetermined magnetic thin film is formed on the substrate.

When the oxidation processing chamber 1161 needs to oxidize the magnetic thin film formed on the substrate surface, the substrate is transported and oxidized in it as appropriate at necessary timings.

The substrate is transported into the analysis chamber 1141 as appropriate in order to analyze various kinds of characteristics of the thin film formed on the substrate surface in the foregoing way.

The substrate is positioned at the irradiation position of the electron beam source by the above-mentioned spinning unit and revolving unit, and irradiated with a beam. Various kinds of characteristics of the substrate surface can be analyzed by analyzing, using the beam analysis unit, signals such as secondary electrons or characteristic X-rays generated by the substrate upon this beam irradiation.

The substrate having a predetermined magnetic thin film formed on it is transported into the load lock chamber 1113 by the vacuum transport robot, and is unloaded from it through an atmospheric transport system (not shown).

The present invention is applicable to a substrate processing chamber and an analysis chamber and, more specifically, to a substrate processing apparatus which needs to include a substrate holder that can arbitrarily determine the substrate direction and position.

Although preferred embodiments of the present invention have been described above with reference to the accompanying drawings, the present invention is not limited to these embodiments, and can be changed into various forms within the technical scope understood from a description of the scope of claims.

This application claims priority based on Japanese Patent Application No. 2007-334236, filed Dec. 26, 2007, which is hereby incorporated by reference herein in its entirety.

The invention claimed is:

1. A sputtering apparatus comprising:
a substrate holder including a first stage which can mount a substrate and can rotate about a first rotating shaft, a second stage which can rotate about a second rotating shaft shifted from the first rotating shaft of said first stage, a spinning unit adapted to rotate said first stage about the first rotating shaft, and a revolving unit adapted to revolve said first stage about the second rotating shaft by rotating said second stage about the second rotating shaft;
a magnetic field applying unit disposed around a periphery of said second stage to apply a magnetic field in a specific direction to the substrate; and
a target mounting table which can mount a target configured to deposit a film on the substrate,
wherein said spinning unit rotates said first stage in a direction opposite to a direction of the rotation of said revolving unit, and rotates said first stage so as to maintain the specific direction of the magnetic field applied to the substrate by said magnetic field applying unit.

2. The sputtering apparatus according to claim 1, further comprising:
a first detection mechanism configured to detect information of a rotation angle of said spinning unit;
a second detection mechanism configured to detect information of a rotation angle of said revolving unit; and
a control unit adapted to control the rotation of said spinning unit and the rotation of said revolving unit based on the pieces of information of the rotation angles detected by said first detection mechanism and said second detection mechanism, respectively.

3. The sputtering apparatus according to claim 1, wherein said second stage has, within a plane of said second stage, a recess in which said first stage is fitted, and a depth of the recess is the same as a height of said first stage.

4. The sputtering apparatus according to claim 1, wherein said revolving unit comprises:
a driving unit adapted to generate a rotational motion to rotate said second stage about the second rotating shaft, said spinning unit comprises,
a fixed shaft of which a first end is fixed;
a first gear attached to a second end of said fixed shaft;
a second gear attached to the first rotating shaft; and
a belt member which connects said first gear and said second gear,
wherein a gear ratio between said first gear and said second gear is 1:1.

5. The sputtering apparatus according to claim 4, further comprising:
a driving transmission shaft connected to said driving unit; and
a member including, in an outer peripheral portion thereof, a third gear which meshes with said driving transmission shaft and is configured to transmit the rotational motion of said driving unit to said second stage.

6. The sputtering apparatus according to claim 5, wherein said member is supported to be rotatable about said fixed shaft through a bearing.

7. The sputtering apparatus according to claim 1, wherein said magnetic field applying unit includes an electromagnet.

8. The sputtering apparatus according to claim 1, wherein said magnetic field applying unit is configured to form magnetic field over an entire surface of said second stage.

9. The sputtering apparatus according to claim 1, wherein in a state where said first stage and said second stage rotate, said magnetic field applying unit does not rotate, and a position of said magnetic field applying unit is not changed.

10. The sputtering apparatus according to claim 1, wherein said target mounting table is configured to be nonparallel to a substrate mounting surface of said first stage.

11. A sputter deposition method of depositing a film on a substrate by sputtering a particle onto the substrate, comprising:
a placement step of placing the substrate on a substrate holder of a sputtering apparatus, recited in claim 1, including a first stage which can rotate about a first rotating shaft, a second stage which can rotate about a second rotating shaft shifted from the first rotating shaft of the first stage, a spinning unit adapted to rotate the first stage about the first rotating shaft, and a revolving unit adapted to revolve the first stage about the second rotating shaft by rotating the second stage about the second rotating shaft;

a magnetic field applying step of applying a magnetic field in a specific direction to the substrate placed on the substrate holder;

a spinning step of rotating the first stage disposed on the substrate holder about the first rotating shaft;

a revolving step of revolving the first stage about the second rotating shaft by rotating the second stage disposed on the substrate holder about the second rotating shaft; and a control step of rotating the first stage in a direction opposite to a direction of the rotation in the revolving step, and controlling the rotation of the first stage in the spinning step so as to maintain the specific direction of the magnetic field applied to the substrate in the magnetic field applying step.

* * * * *